US012641950B2

(12) United States Patent
Zhang et al.

(10) Patent No.: US 12,641,950 B2
(45) Date of Patent: May 26, 2026

(54) OLED LIGHT-EMITTING UNIT, OLED SUBSTRATE AND METHOD FOR MANUFACTURING OLED LIGHT-EMITTING UNIT

(71) Applicants: Chengdu BOE Optoelectronics Technology Co., Ltd., Chengdu (CN); BOE Technology Group Co., Ltd., Beijing (CN)

(72) Inventors: Wei Zhang, Beijing (CN); Cheng Zeng, Beijing (CN); Wanmei Qing, Beijing (CN); Jinyu Li, Beijing (CN); Bing Liao, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 868 days.

(21) Appl. No.: 17/788,596

(22) PCT Filed: Aug. 11, 2021

(86) PCT No.: PCT/CN2021/112071
§ 371 (c)(1),
(2) Date: Jun. 23, 2022

(87) PCT Pub. No.: WO2022/062748
PCT Pub. Date: Mar. 31, 2022

(65) Prior Publication Data
US 2023/0037094 A1 Feb. 2, 2023

(30) Foreign Application Priority Data

Sep. 28, 2020 (CN) .......................... 202011039372.7

(51) Int. Cl.
*H10K 50/816* (2023.01)
*H10K 50/813* (2023.01)
(Continued)

(52) U.S. Cl.
CPC ......... *H10K 50/816* (2023.02); *H10K 50/813* (2023.02); *H10K 50/854* (2023.02);
(Continued)

(58) Field of Classification Search
CPC .. H10K 50/816; H10K 50/813; H10K 50/854; H10K 71/00; H10K 2102/103;
(Continued)

(56) References Cited

U.S. PATENT DOCUMENTS

| | | | | | |
|---|---|---|---|---|---|
| 2019/0165323 A1* | 5/2019 | Jo | .......................... | H10K 50/81 |
| 2020/0274087 A1* | 8/2020 | Lee | ....................... | H10K 50/15 |
| 2020/0328370 A1 | 10/2020 | Lee | | |

FOREIGN PATENT DOCUMENTS

| | | |
|---|---|---|
| CN | 103594652 A | 2/2014 |
| CN | 107170786 A | 9/2017 |

(Continued)

OTHER PUBLICATIONS

PCT/CN2021/112071 international search report and written opinion.

*Primary Examiner* — Julia Slutsker
(74) *Attorney, Agent, or Firm* — IPro, PLLC

(57) ABSTRACT

The present application relates to an OLED light-emitting unit for use in a top-emission OLED substrate, which includes an anode, a cathode, and an organic functional layer arranged between the anode and the cathode. The anode includes a first metal layer and a second metal layer arranged in sequence, a separation layer is arranged between the first metal layer and the second metal layer, and a thickness of the second metal layer is within a preset threshold range such (Continued)

that metal atoms of the second metal layer are capable of being thermally agglomerated and rearranged under a preset condition to form a concave-convex structure on a surface of the second metal layer.

10 Claims, 2 Drawing Sheets

(51) Int. Cl.

| | | |
|---|---|---|
| *H10K 50/854* | (2023.01) | |
| *H10K 71/00* | (2023.01) | |
| *H10K 102/00* | (2023.01) | |
| *H10K 102/10* | (2023.01) | |

(52) U.S. Cl.
CPC ....... *H10K 71/00* (2023.02); *H10K 2102/103* (2023.02); *H10K 2102/3026* (2023.02)

(58) Field of Classification Search
CPC ........... H10K 2102/3026; H10K 50/81; H10K 50/85; H10K 50/856; Y02B 20/30
See application file for complete search history.

(56) References Cited

FOREIGN PATENT DOCUMENTS

| CN | 109524575 A | 3/2019 |
|---|---|---|
| CN | 112164759 A | 1/2021 |

* cited by examiner

L-Decay

Angel (°)

OLED LIGHT-EMITTING UNIT, OLED SUBSTRATE AND METHOD FOR MANUFACTURING OLED LIGHT-EMITTING UNIT

CROSS-REFERENCE TO RELATED APPLICATIONS

This application is the U.S. national phase of PCT Application No. PCT/CN2021/112071 filed on Aug. 11, 2021, which claims a priority to Chinese Patent Application No. 202011039372.7 filed in China on Sep. 28, 2020, the entire contents of which are hereby incorporated by reference.

TECHNICAL FIELD

The present disclosure relates to the technical field of manufacturing of display products, and in particular, to an OLED light-emitting unit, an OLED substrate, and a method for manufacturing the OLED light-emitting unit.

BACKGROUND

The Organic Light-Emitting Diode (OLED) display technology has the features of self-luminescence, wide viewing angle, wide color gamut, high contrast, slimness, foldability, bendability, and portability, and has become the main direction of research and development in the field of display. Because of microcavity optics, OLED devices may change color somewhat with the viewing angle, and the brightness generally decreases. Nowadays, more and more people use curved screens, and curved screens allow viewing from the front viewing angle and the large side viewing angle at the same time, so the requirements for the color cast from a viewing angle and luminance decay (L-decay) of a screen are relatively high.

SUMMARY

In order to solve the above-mentioned technical problem, the present disclosure provides an OLED light-emitting unit, an OLED substrate and a method for manufacturing the OLED light-emitting unit, so as to solve the problems of color cast from a viewing angle and luminance decay (L-decay).

In order to achieve the above objective, embodiments of the present disclosure adopt the following technical solutions: an OLED light-emitting unit for use in a top-emission OLED substrate, including: an anode, a cathode, and an organic functional layer arranged between the anode and the cathode. The anode comprises a first metal layer and a second metal layer arranged in sequence, a separation layer is arranged between the first metal layer and the second metal layer, and a thickness of the second metal layer is within a preset threshold range such that metal atoms of the second metal layer are capable of being thermally agglomerated and being rearranged under a preset condition to form a concave-convex structure on a surface of the second metal layer.

Optionally, the second metal layer is made of silver, and the thickness of the second metal layer is smaller than 40 nm.

Optionally, the thickness of the second metal layer is 15 nm to 30 nm.

Optionally, the preset condition comprises heating the second metal layer at a preset temperature for a preset time in an inert gas environment, wherein a thickness of a convex portion of the concavo-convex structure formed on the second metal layer is positively correlated with the heating temperature and the heating time.

Optionally, the preset temperature is 100 degrees to 200 degrees, and the preset time is 1 hour to 5 hours.

Optionally, a transparent conductive film layer is arranged on a side of the second metal layer away from the first metal layer.

Optionally, the separation layer is made of an ITO material.

An embodiment of the present disclosure further provides an OLED display substrate, including the OLED light-emitting unit described above.

An embodiment of the present disclosure further provides a method for manufacturing an OLED light-emitting unit, which is used for manufacturing the OLED light-emitting unit described above. The method includes: forming an anode, an organic functional layer and a cathode in sequence, wherein the forming the anode specifically includes:

forming the first metal layer and the separation layer in sequence;

forming the second metal layer on the separation layer, specifically comprising:

depositing a metal layer on the separation layer; and heating the metal layer at a preset temperature for a preset time in an inert gas environment such that metal atoms of the metal layer thermally are agglomerated and rearranged to form the concave-convex structure on a surface of the metal layer.

Optionally, the heating the metal layer at the preset temperature for the preset time in the inert gas environment such that the metal atoms of the metal layer are thermally agglomerated and rearranged to form the concave-convex structure on the surface of the metal layer specifically comprises: heating the metal layer at a temperature of 200 degrees for 1 hour in a nitrogen atmosphere such that the metal atoms of the metal layer are thermally agglomerated and rearranged to form the concave-convex structure on the surface of the metal layer.

Optionally, the method further includes: forming a transparent conductive film layer on the second metal layer.

Optionally, the forming the first metal layer and the separation layer in sequence comprises: forming the first metal layer by using Ag through a vapor deposition process; and forming the separation layer on the first metal layer by using an ITO material through the vapor deposition process.

The present disclosure has the following beneficial effects: the concave-convex structure of the second metal layer causes a diffuse reflection effect of the light to occur, and under such diffuse reflection effect, light rays not from the front viewing angle are enhanced, hereby reducing a visual difference caused by difference brightness between a side edge of a curved surface and the front view of a screen.

DETAILED DESCRIPTION

In order to make the objective, technical solutions and advantages of embodiments of the present disclosure clearer, a more particular description of the embodiments of the present disclosure will be rendered by reference to the appended drawings. It is to be understood that the described embodiments are part, but not all, of the disclosed embodiments. Based on the embodiments of the present disclosure described, all other embodiments obtained by one of ordinary skill in the art are within the scope of the present disclosure.

In the description of the present disclosure, it should be noted that such terms as "central", "upper", "lower", "left", "right", "vertical", "horizontal", "inner" and "outer" indicate orientations or positional relationships based on the orientations or positional relationships shown in the figures, merely to facilitate description of the present disclosure and simplify the description, and do not indicate or imply that the referenced devices or elements must have a particular orientation, be constructed and operated in a particular orientation, and thus should not be construed as limiting the present disclosure. Furthermore, terms such as "first", "second", and "third" are used for descriptive purposes only and are not to be construed as indicating or implying relative importance.

In order to improve the color cast of a screen, a method of adjusting a structure of a device is adopted in the related technology. Adjusting the structure of the device can improve color change of the screen at multiple angles in the case of displaying a white picture, but this method cannot simultaneously consider brightness decays at various angles. Therefore, visual changes are still perceived on side edges of the curved screen.

Figure 1:
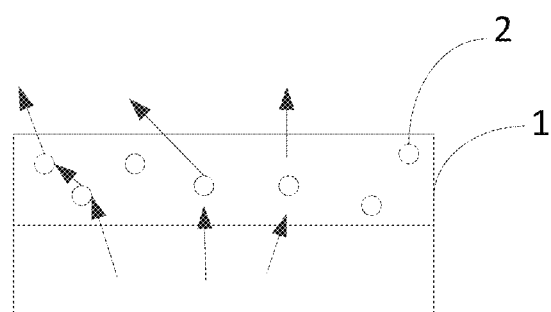
FIG. 1 shows a schematic diagram illustrating a structure of a scattering film layer in the related art.

The color cast of the screen can also be improved by enabling the light exiting from a microcavity passing through a scattering film layer. As shown in FIG. 1, after the light emitted from the OLED passes through scattering particles 2 in a scattering film layer 1, a path of the light is changed, the light incident perpendicularly is emitted at an angle after being scattered by the scattering particles 2, and the angled light may be emitted perpendicularly after passing through the scattering particles 2. For a microcavity device, with the change of angle, the spectral distribution and intensity of light emitted by the device change, which causes the change of color coordinates and the change of brightness. However, after scattering by the scattering particles, these spectra are remixed, which reduce the variation of the color coordinates with angle, and the variation of the brightness with the viewing angle is reduced because the scattering of the light from the front viewing angle enhances or compensates the light from the side viewing angle. However, this method requires a separate scattering film layer, which increases the cost of the screen.

Still other approaches are used to incorporate scattering particles into certain film layers of the device. Because these particles are relatively large, it is difficult to incorporate them into these film layers by evaporation. Therefore, it is often only possible to make the particles into the film layer by a solution process by mixing the particles into a solution. There is also a large gap in performances of the current solution process and the evaporation process. In addition, there are many methods for patterning an anode, and photolithography is often used to form fixed patterns on the anode, and these patterns can also achieve the scattering effect. Such a method need to add a photomask (mask) when used in mass production, which also increases the cost of the screen.

Figure 3:
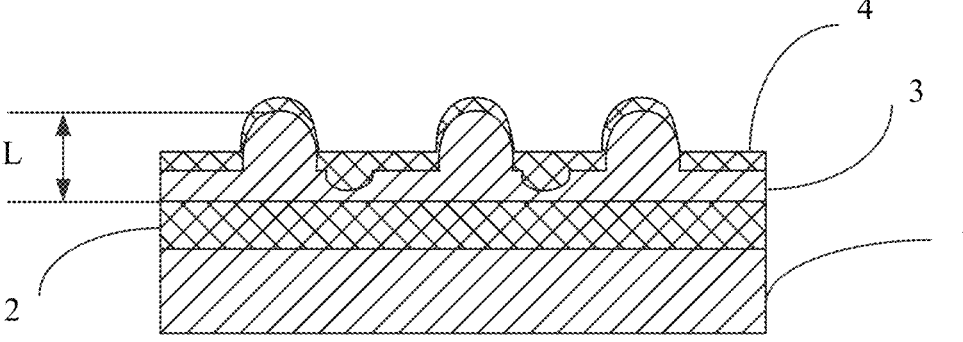
FIG. 3 shows a schematic structural diagram of an anode of an OLED light-emitting unit according to an embodiment of the present disclosure.

In view of the above problems, an embodiment of the present disclosure provides an OLED light-emitting unit for use in a top-emission OLED substrate, including an anode, a cathode, and an organic functional layer arranged between the anode and the cathode. The anode includes a first metal layer 1 and a second metal layer 3 arranged in sequence, and a separation layer 2 is arranged between the first metal layer 1 and the second metal layer 3. A thickness of the second metal layer 3 is within a preset threshold range such that metal atoms of the second metal layer 3 are able to be thermally agglomerated under preset conditions and to be rearranged to form a concave-convex structure on a surface of the second metal layer 3, with reference to FIG. 3.

By utilizing the thermal agglomeration phenomenon of the second metal layer 3 upon thermal annealing, a concave-convex structure is formed on the anode of the OLED light-emitting unit. By using the concave-convex structure to realize light scattering, the problem that the brightness of the microcavity device rapidly decreases with the change of an angle is reduced, and the visual difference caused by the brightness difference at various viewing angles of a screen can be reduced. In addition, the anode of the OLED light-emitting unit may be made by Back Plate (BP) circuit process and device in the related art, and the concave-convex structure can be formed without forming a pattern on the anode by means of adding a mask (patterning process), so that the problem of slowing down the brightness decay is solved, and the cost is relatively low.

Illustratively in an embodiment, the second metal layer 3 is made of silver, and the thickness of the second metal layer 3 is less than 40 nm.

A surface diffusion energy of Ag atoms is about 0.32 eV. In baking at a high temperature, the energy of Ag atoms exceeds the surface diffusion energy and then migrates and rearranges on a surface of the film, so that the overall energy is relatively low. The diffusion strength is also affected by the thickness of the Ag thin film (namely, the second metal layer 3), and when the Ag thin film is relatively thin, Ag atoms are easily diffused on the surface under the effect of heating; when the Ag thin film is relatively thick, surface diffusion is relatively difficult to occur under the effect of heating. In an embodiment, the thickness of the second metal layer 3 is less than 40 nm, which facilitates the diffusion of Ag atoms on the surface of the second metal layer 3 under the effect of heating, thereby facilitating the formation of the concave-convex structure.

Illustratively in an embodiment, the thickness of the second metal layer 3 ranges from 15 nm to 30 nm, but is not limited thereto.

It should be noted that since an anode of a top-emission OLED substrate needs to satisfy the requirement of total reflection, the anode needs to have a certain thickness, and in order to form a concave-convex structure, the thickness of a corresponding metal layer cannot be too large. Therefore, illustratively In an embodiment, the structure of the second metal layer 3 formed on the first metal layer 1 is adopted, in which the first metal layer 1 enables the anode to satisfy the requirement of total reflection of light, and the concave-convex structure is formed on the surface of the second metal layer 3, so as to solve the problem of luminance decay of the OLED substrate.

In the embodiment, the separation layer 2 is provided to separate the first metal layer 1 from the second metal layer 3, ensuring the thermal stability of the anode and facilitating the formation of the concave-convex structure on the second metal layer 3.

Illustratively In an embodiment, the first metal layer 1 is made of Ag material, and the thickness of the first metal layer 1 ranges from 70 nm to 150 nm, but not limited thereto.

In the embodiment, the first metal layer 1 and the second metal layer 3 are both made of Ag material, and the first metal layer 1 and the second metal layer 3 are separated by the separation layer 2, so that the first metal layer 1 ensures the anode to meet the requirement of total reflection of light, and the second metal layer 3 forms the concave-convex structure on the surface thereof through heating so as to solve the problem of brightness decay.

It should be noted that materials of the first metal layer 1 and the second metal layer 3 may be the same or different, and may be made of a metal other than Ag, but not limited thereto. Since the Ag material absorbs less light, in order to improve the effective utilization rate of light, the first metal layer 1 and the second metal layer 3 are preferably made of Ag material in the embodiments.

Illustratively in an embodiment, the preset condition includes heating the second metal layer 3 at a preset temperature for a preset time in an inert gas environment, where the thickness of a convex portion of the concavo-convex structure formed on the second metal layer 3 is positively correlated with the heating temperature and the heating time.

It should be noted that the concave-convex structure includes a concave portion and a convex portion, the second metal layer 3 includes a first region provided with the convex portion and a second region provided with the concave portion, and when the thickness of the second metal layer 3 is constant (referring to the thickness of the second metal layer 3 before the concave-convex structure is formed, or the thickness of a flat region of the second metal layer 3), the thickness of the first region is positively correlated to the heating temperature and the heating time. The thicker the thickness of the second metal layer 3 is, the higher the heating temperature for forming a pre-set concave-convex structure is, and the longer the heating time is.

In an embodiment, the size and height of the convex portion may be controlled by controlling the above variables (heating temperature, heating time, and the thickness of the second metal layer 3) so that the convex portion is not so high as to cause the short circuit problem of the OLED device.

Illustratively In an embodiment, the preset temperature is 100-200 degrees, and the preset time is 1-5 hours.

In practical use, the preset temperature and the preset time may be determined according to the thickness of the second metal layer and the height of the convex portion to be formed. In a particular implementation of this embodiment, the preset temperature is 200 degrees and the preset time is 1 hour, and under these preset conditions, the thickness of the first region is 28 nm, with reference to the thickness L of the first region in FIG. 3.

Figure 2:
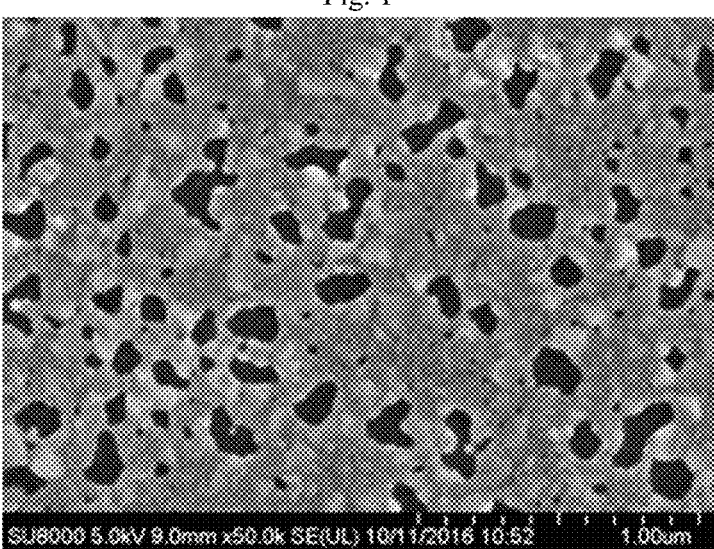
FIG. 2 shows a scanning electron micrograph of a second metal layer according to an embodiment of the present disclosure.

It should be noted that the second metal layer 3 is thin, and atoms easily diffuse on the surface when heated. Since a large number of Ag atoms migrate to new positions on the surface of the second metal layer 3, some protrusions (namely, the convex portion in the concave-convex structure) will eventually be formed on the surface of the second metal layer 3, and some depressions (namely, the concave portion in the concave-convex structure) will be formed on the positions where the Ag atoms are migrated away. FIG. 2 is a scanning electron microscope image of the second metal layer 3 after being baked at a high temperature, where a white part is a convex portion and a black part is a concave portion. In a relatively small area (e.g. 1 um*1 um), the convex portions and concave portions in FIG. 2 may not be uniform enough, but in a larger area (e.g. 10 um*10 um), the convex portions and concave portions in the figure are randomly distributed, and this random distribution can make the luminous intensities and spectra of an OLED device in 360 degrees tend to be uniform, avoiding the problem that colors or brightnesses of a screen in multiple directions are not inconsistent due to the unevenness of the substrate.

Illustratively in an embodiment, a transparent conductive film layer 4 is arranged at a side of the second metal layer 3 away from the first metal layer 1.

Illustratively in an embodiment, the transparent conductive film layer 4 is made of an ITO material, but not limited thereto.

Indium oxide ($In_2O_3$) is a semiconductor material widely used in optical and electrical devices. Pure $In_2O_3$ crystals have poor conductivity and are usually doped to improve their conductivity. The most common doping element tin is doped to form indium tin oxide (ITO). ITO is a highly degenerate n-type semiconductor, and the Fermi level is located above the bottom of the conduction band. Due to the substitutional doping of Sn, excessive electrons are formed at a doping position inside a crystal, and oxygen vacancies are generated during the preparation process of ITO, thus having a high carrier concentration and a low resistivity. In addition, the band gap of ITO is wide, so that the ITO thin film has a high transmittance for visible light and near infrared light. Due to the above unique properties, ITO is widely used in organic light-emitting devices (OLED), solar cells, flat panel displays, transparent shielding materials, etc.

The hottest applied research is to use an ITO material as the anode of the OLED display device to provide holes, which meet electrons generated from a metal cathode in an organic light-emitting layer to excite photons. In the OLED display device, carriers are injected from an electrode into the light-emitting layer under the action of an electric field to recombine and emit light. The material of the anode is required to have a high surface work function and good transparency to facilitate stable performance of the OLED display device. $In_2O_3$ and ITO surfaces have been modified by various surface treatment techniques and modification means to increase the surface work function and facilitate their hole injection capabilities in OLED display devices.

In an embodiment, the OLED light-emitting unit is applied to a top-emission OLED substrate, and the top-emission OLED substrate includes an anode, a cathode and an organic functional layer between the anode and the cathode, which are arranged in sequence. The organic functional layer includes a hole injection layer (HTL), a hole transport layer (HTL), an organic light-emitting layer and an electron transport layer which are arranged in sequence on the anode, and the anode serves as a reflective electrode to reflect light emitted by the organic light-emitting layer. In an embodiment, the Ag material is used to fabricating the second metal layer 3, because the work function of Ag is 4.26 eV. A typical hole injection layer material has a work function of 5.3 eV, or even higher. If the material of the hole injection layer or the material of the hole transport layer is evaporated directly on the second metal layer 3, a voltage of the OLED device will be very high. Therefore, in an embodiment, a transparent conductive film layer 4 is deposited on the second metal layer 3 by means of physical vapor deposition (PVD) to increase the work function, thereby reducing the operating voltage of the device.

Illustratively in an embodiment, the transparent conductive film layer 4 has a thickness of 5 nm to 15 nm, which is not limited thereto.

Illustratively in an embodiment, the separation layer 2 is made of an ITO material, but it is not limited thereto, as long as the separation function can be achieved to separate the first metal layer 1 and the second metal layer 3 into two different parts.

An embodiment of the present disclosure further provides an LED display substrate including the OLED light-emitting unit described above.

The OLED light-emitting unit comprises an anode, a cathode, and an organic functional layer arranged between the anode and the cathode. The organic functional layer includes a hole injection layer (HTL), a hole transport layer (HTL), an organic light-emitting layer and an electron transport layer which are arranged in sequence on the anode, and the OLED light-emitting unit is an RGB monochromatic light-emitting unit.

Figure 4:
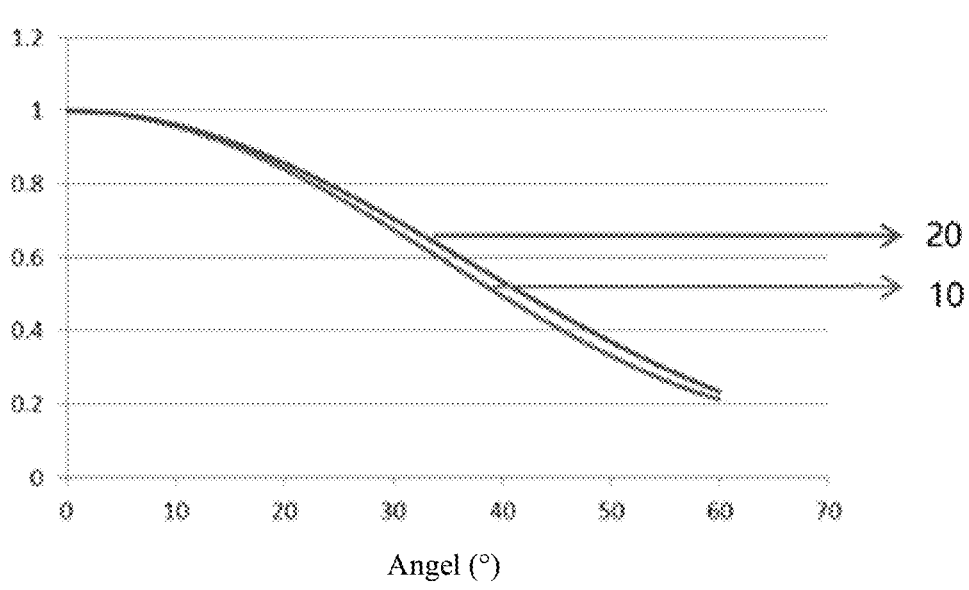
FIG. 4 shows a schematic diagram illustrating a simulation effect of luminance decay according to an embodiment of the present disclosure.

The organic functional layer (including the hole injection layer, the hole transport layer, the light-emitting layer, and the electron transport layer) and the cathode are evaporated on the above-mentioned anode to fabricate a top-emission OLED device. Because of random unevenness of the anode, with reference to FIG. 3, a certain diffuse reflection effect occurs when light irradiates on both the concave and convex portions of the concavo-convex structure, and light rays not from the front viewing angle are enhanced due to the diffuse reflection effect. Through the software simulation, there will be an effect as shown in FIG. 4. In FIG. 4, reference sign 10 represents a luminance decay curve of an anode with a flat surface, and reference sign 20 represents a luminance decay curve of an anode with a concave-convex structure on the surface, the luminance of which will be higher than the former, reducing a visual difference caused by a luminance difference between a side edge of the curved surface and the front view of a screen.

An embodiment of the present disclosure further provides a method for manufacturing an OLED light-emitting unit, which is used for manufacturing the OLED light-emitting unit described above. The method includes: forming an anode, an organic functional layer and a cathode in sequence, wherein the forming the anode specifically includes:

forming a first metal layer 1 and a separation layer 2 in sequence;

forming a second metal layer 3 on the separation layer 2, which specifically includes:

depositing a metal layer on the separation layer 2; and heating the metal layer at a preset temperature for a preset time in an inert gas environment such that metal atoms of the metal layer thermally agglomerate and are rearranged to form a concave-convex structure on a surface of the metal layer.

Illustratively in an embodiment, the heating the metal layer at a preset temperature for a preset time in an inert gas environment such that metal atoms of the metal layer thermally agglomerate and are rearranged to form a concave-convex structure on a surface of the metal layer, specifically includes:

heating the metal layer at a temperature of 200 degrees for 1 hour in a nitrogen atmosphere such that the metal atoms of the metal layer thermally agglomerate and are rearranged to form the concave-convex structure on the surface of the metal layer.

Illustratively in an embodiment, the method further includes:

forming a transparent conductive film layer 4 on the second metal layer 3 by using ITO material.

Illustratively in an embodiment, the forming the first metal layer 1 and the separation layer 2 in sequence includes:

forming the first metal layer 1 by using Ag through a vapor deposition process; and forming the separation layer 2 on the first metal layer 1 by using ITO material through the vapor deposition process.

It is to be understood that the above-described embodiments are merely exemplary implementations that have been employed to illustrate the principles of the present disclosure, and the present disclosure is not limited thereto. Those skilled in the art can make various variations and improvements without departing from the spirit and essential of the present disclosure, and these variations and improvements shall also fall within the protection scope of the present disclosure.

What is claimed is:

1. An OLED light-emitting unit, applied in a top-emission OLED substrate, comprising: an anode, a cathode, and an organic functional layer arranged between the anode and the cathode, wherein the anode comprises a first metal layer and a second metal layer, and the first metal layer and the second metal layer are stacked along a thickness direction of the second metal layer, a separation layer is arranged between the first metal layer and the second metal layer, and a thickness of the second metal layer is smaller than 40 nm such that metal atoms of the second metal layer are capable of being thermally agglomerated and being rearranged under a preset condition to form a concave-convex structure on a surface of the second metal layer;

wherein the first metal layer and the second metal layer are separated by the separation layer, and the second metal layer excludes the concave-convex structure;

wherein the preset condition comprises heating the second metal layer at a preset temperature for a preset time in an inert gas environment, wherein a thickness of a convex portion of the concavo-convex structure formed on the second metal layer is positively correlated with the heating temperature and the heating time;

wherein the preset temperature is 100 degrees to 200 degrees, and the preset time is 1 hour to 5 hours.

2. The OLED light-emitting unit according to claim 1, wherein the second metal layer is made of silver.

3. The OLED light-emitting unit according to claim 2, wherein the thickness of the second metal layer is 15 nm to 30 nm.

4. The OLED light-emitting unit according to claim 2, wherein a transparent conductive film layer is arranged on a side of the second metal layer away from the first metal layer.

5. The OLED light-emitting unit according to claim 1, wherein the separation layer is made of an ITO material.

6. An OLED display substrate, comprising the OLED light-emitting unit according to claim 1.

7. A method for manufacturing an OLED light-emitting unit, used for manufacturing the OLED light-emitting unit according to claim 1, and comprising:

forming the anode, the organic functional layer and the cathode in sequence, wherein the forming the anode specifically comprises:

forming the first metal layer and the separation layer in sequence;

forming the second metal layer on the separation layer, specifically comprising:

depositing a metal layer on the separation layer; and heating the metal layer at a preset temperature for a preset time in an inert gas environment such that metal atoms of the metal layer thermally are agglomerated and rearranged to form the concave-convex structure on a surface of the metal layer;

wherein the preset temperature is 100 degrees to 200 degrees, and the preset time is 1 hour to 5 hours.

8. The method for manufacturing an OLED light-emitting unit according to claim 7, wherein the heating the metal layer at the preset temperature for the preset time in the inert gas environment such that the metal atoms of the metal layer are thermally agglomerated and rearranged to form the concave-convex structure on the surface of the metal layer specifically comprises:

heating the metal layer at a temperature of 200 degrees for 1 hour in a nitrogen atmosphere such that the metal atoms of the metal layer are thermally agglomerated and rearranged to form the concave-convex structure on the surface of the metal layer.

9. The method for manufacturing an OLED light-emitting unit according to claim 7, further comprising:

forming a transparent conductive film layer on the second metal layer.

10. The method for manufacturing an OLED light-emitting unit according to claim 7, wherein the forming the first metal layer and the separation layer in sequence comprises:

forming the first metal layer by using Ag through a vapor deposition process; and forming the separation layer on the first metal layer by using an ITO material through the vapor deposition process.

* * * * *